(12) United States Patent
Jang et al.

(10) Patent No.: US 11,832,478 B2
(45) Date of Patent: Nov. 28, 2023

(54) DISPLAY DEVICE

(71) Applicant: Samsung Display Co., Ltd., Yongin-Si (KR)

(72) Inventors: Sumi Jang, Asan-si (KR); Minchae Kwak, Seoul (KR); Kyeonghwa Kim, Asan-si (KR); Mihae Kim, Asan-si (KR); Kyonghwan Oh, Seoul (KR); Seunghan Jo, Seoul (KR); Jae-Ho Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 274 days.

(21) Appl. No.: 17/332,139

(22) Filed: May 27, 2021

(65) Prior Publication Data

US 2022/0102436 A1    Mar. 31, 2022

(30) Foreign Application Priority Data

Sep. 25, 2020   (KR) .................... 10-2020-0124925

(51) Int. Cl.
*H01L 21/00* (2006.01)
*H10K 59/121* (2023.01)
*H10K 59/131* (2023.01)

(52) U.S. Cl.
CPC ......... *H10K 59/121* (2023.02); *H10K 59/131* (2023.02)

(58) Field of Classification Search
CPC ........................ H10K 59/121; H10K 59/131
See application file for complete search history.

(56) References Cited

U.S. PATENT DOCUMENTS

2016/0019841 A1*  1/2016  Woo .................... G09G 3/3233
                                                345/204
2021/0091159 A1*  3/2021  Lee ....................... H10K 59/88

FOREIGN PATENT DOCUMENTS

KR    10-0188118 B1    6/1999

* cited by examiner

*Primary Examiner* — Douglas M Menz
(74) *Attorney, Agent, or Firm* — Innovation Counsel LLP

(57) ABSTRACT

A display device includes a circular display area and a non-display area surrounding the circular display area. The display device may further include a load matcher disposed adjacent to an edge of the circular display area in the circular display area, a pixel disposed in the circular display area, spaced apart from the non-display area by the load matcher, and connected to the load matcher, and a repair pixel disposed adjacent to the edge of the circular display area in the non-display area, and connected to the pixel.

20 Claims, 12 Drawing Sheets

DISPLAY DEVICE

CROSS-REFERENCE TO RELATED APPLICATION(S)

This application claims priority to and benefits of Korean Patent Application No. 10-2020-0124925 under 35 U.S.C. § 119 filed on Sep. 25, 2020 in the Korean Intellectual Property Office, the entire contents of which are incorporated herein by reference.

BACKGROUND

1. Technical Field

Embodiments relate generally to a display device and more particularly to a display device including a plurality of pixels.

2. Description of the Related Art

A display device may include a plurality of pixels. The pixels may include a light emitting element. For example, the light emitting element may include an organic light emitting diode, a quantum-dot light emitting diode, a quantum-dot nano light emitting diode, and similar light emitting elements.

The display device may be applied to various fields and manufactured in various forms. For example, not only display devices having a rectangular shape but also display devices having a circular shape are being manufactured. Through this, the display device may also be applied to a watch. In addition, a display device having a shape in which each vertex is rounded in a conventional rectangular shape is also being manufactured. In this case, the manner in which a plurality of pixels and a plurality of drivers are disposed may vary for each shape.

Recently, research has been conducted to reduce a dead space of the display device and enlarge a display area by appropriately structuring the pixels and the drivers.

SUMMARY

Embodiments provide a display device including a plurality of pixels.

In an embodiment, a display device includes a circular display area and a non-display area surrounding the circular display area. The display device may further include a load matcher, a pixel, and a repair pixel. The load matcher is disposed adjacent to an edge of the circular display area in the circular display area. The pixel is disposed in the circular display area, is spaced apart from the non-display area by the load matcher, and is connected to the load matcher. The repair pixel is disposed adjacent to the edge of the circular display area in the non-display area, and is connected to the pixel.

In an embodiment, the display device may further include a light emitting control driver disposed in the non-display area, and spaced apart from the circular display area by the repair pixel. The repair pixel is connected to the light emitting control driver.

In an embodiment, the display device may further include a lighting circuit disposed in the non-display area, and connected to the pixel.

In an embodiment, the repair pixel may be connected to a first side of the pixel, and the lighting circuit may be connected to a second side perpendicular to the first side of the pixel.

In an embodiment, the light emitting control driver may include a plurality of light emitting control circuits and the lighting circuit may be disposed between the plurality of light emitting control circuits.

In an embodiment, the lighting circuit may transmit a data signal to the pixel.

In an embodiment, the load matcher may include a lower electrode connected to the lighting circuit and an upper electrode disposed on the lower electrode, and overlapping the lower electrode.

In an embodiment, the lower electrode may include protrusion protruding toward the pixel, the protrusion may overlap a data line connecting the pixel and the lighting circuit, and the protrusion may be connected to the data line by a contact hole.

In an embodiment, the data line may be disposed on the upper electrode, and partially may overlap the upper electrode.

In an embodiment, a data signal may be applied to the lower electrode and a power voltage may be applied to the upper electrode.

In an embodiment, the power voltage may be a high power voltage.

In an embodiment, the lower electrode and the upper electrode may form a capacitor.

In an embodiment, the load matcher may be disposed only on the display device.

In an embodiment, a display device includes a display area including a curved portion having a curvature and a non-display area surrounding the display area. The display device may include a load matcher, a pixel, and a repair pixel. The load matcher is disposed adjacent to an edge of the curved portion in the display area. The pixel is disposed in the display area, is spaced apart from the non-display area by the load matcher, and is connected to the load matcher. The repair pixel is disposed adjacent to the edge of the curved portion in the non-display area, and is connected to the pixel.

In an embodiment, the display device may further include a light emitting control driver disposed in the non-display area, and spaced apart from the display area by the repair pixel. The repair pixel may be connected to the light emitting control driver.

In an embodiment, the display device may further include a lighting circuit disposed in the non-display area, and connected to the pixel.

In an embodiment, the repair pixel may be connected to a first side of the pixel, and the lighting circuit may be connected to a second side perpendicular to the first side of the pixel.

In an embodiment, the light emitting control driver may include a plurality of light emitting control circuits and the lighting circuit may be disposed between the plurality of light emitting control circuits.

In an embodiment, the load matcher may include a lower electrode connected to the lighting circuit and an upper electrode disposed on the lower electrode, and overlapping the lower electrode.

In an embodiment, the lower electrode may include a protrusion protruding toward the pixel, the protrusion may overlap a data line connecting the pixel and the lighting circuit, and the protrusion may be connected to the data line by a contact hole.

In an embodiment, a display device includes a circular display area and a non-display area surrounding the display area. The display device may include a load matcher, a pixel, and a repair pixel. The load matcher is disposed adjacent to an edge of the display area in the display area. The pixel is disposed in the display area, is spaced apart from the non-display area by the load matcher, and is connected to the load matcher. The repair pixel is disposed adjacent to the edge of the display area in the non-display area, and connected to the pixel. The repair pixel may be disposed parallel to the light emitting control circuit disposed in the non-display area.

Since the repair pixels are disposed along the edge of the display area in the non-display area, a dead space of the display area may be reduced. In addition, by arranging the repair pixel in parallel with the light emitting control circuit, a smaller space may be occupied than when the repair pixel is disposed in the display area.

BRIEF DESCRIPTION OF THE DRAWINGS

Illustrative, embodiments will be more clearly understood from the following detailed description taken in conjunction with the accompanying drawings.

DETAILED DESCRIPTION OF THE EMBODIMENTS

Hereinafter, display devices in accordance with embodiments will be explained in detail with reference to the accompanying drawings.

Figure 1:
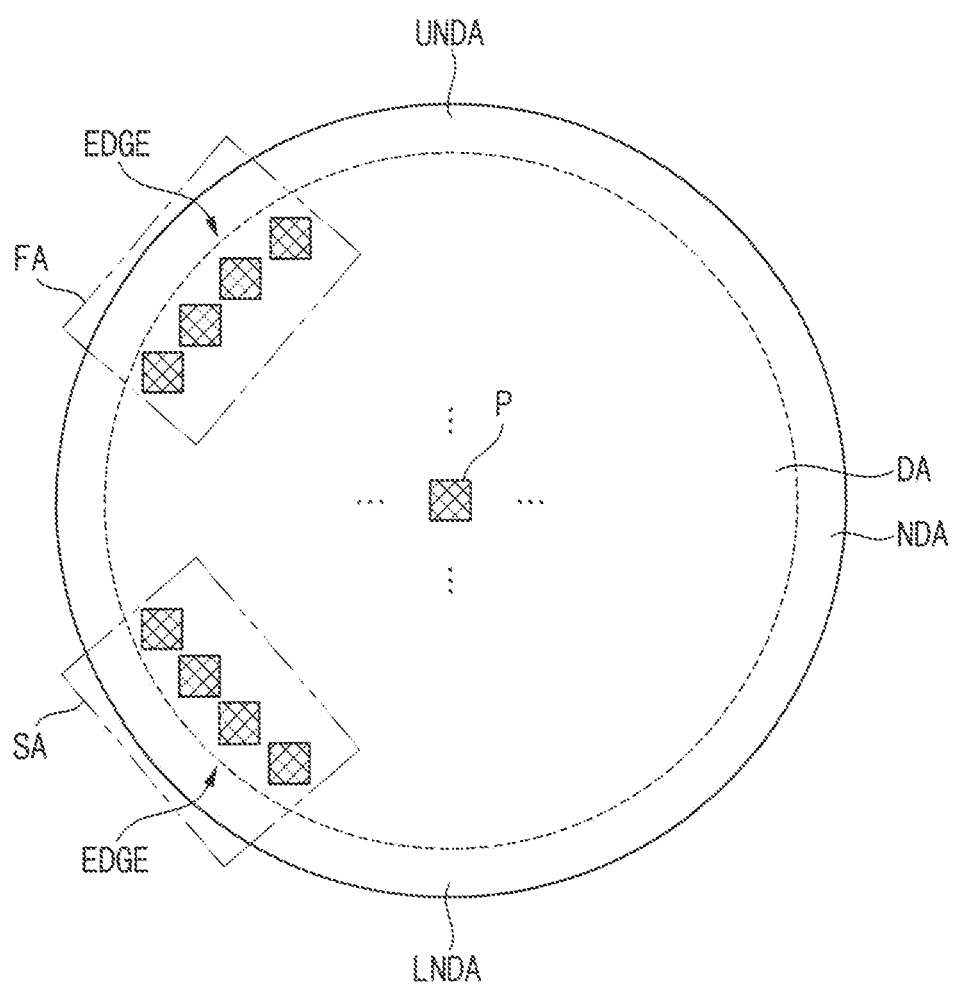
FIG. 1 is a plan view illustrating a display device according to an embodiment.

FIG. 1 is a plan view illustrating a display device according to an embodiment.

Referring to FIG. 1, the display device may include a display area DA and a non-display area NDA. The non-display area NDA may surround the display area DA. In embodiments, the display area DA and the non-display area NDA may have a similar shape. For example, as illustrated in FIG. 1, both the display area DA and the non-display area NDA may have a circular shape. However, in embodiments, the non-display area NDA may have a polygonal shape.

In embodiments, the display area DA may be circular. In FIG. 1, the display area DA is illustrated in a circular shape having a constant curvature, but in an embodiment, the display area DA is a shape other than a circular shape having a constant curvature. For example, the display area DA may have an elliptical shape.

A plurality of pixels P may be disposed in the display area DA. Each of the pixels P may include a plurality of sub-pixels. For example, each of the pixels P may include three sub-pixels that emit red, green, and blue light. However, each of the pixels P may include more or less than three sub-pixels. For example, each of the pixels P may include two sub-pixels, or may include four or more sub-pixels.

In embodiments, the pixels P may be disposed in various ways within a range in which an image may be displayed in the display area DA. For example, the pixels P may be generally disposed in a matrix form, and may be disposed in a stepwise form along the curvature of the display area DA at an edge of the display area DA. That is, the pixels P may be disposed along the edge of the display area DA. Through this, the display device may display an image overall in the circular display area DA.

The non-display area NDA may include an upper non-display area UNDA and a lower non-display area LNDA. In embodiments, various components for driving the pixels P may be disposed in the non-display area NDA. For example, a plurality of drivers may be disposed in the non-display area NDA. That is, a light emitting control driver, a data driver, and a scan driver may be disposed in the non-display area NDA. In addition, in embodiments, a lighting circuit may be disposed in the non-display area NDA. The lighting circuit may serve to check whether the pixels P operate normally.

In embodiments, the lighting circuit may be disposed in the upper non-display area UNDA, and the data driver may be disposed in the lower non-display area LNDA.

Figure 2:
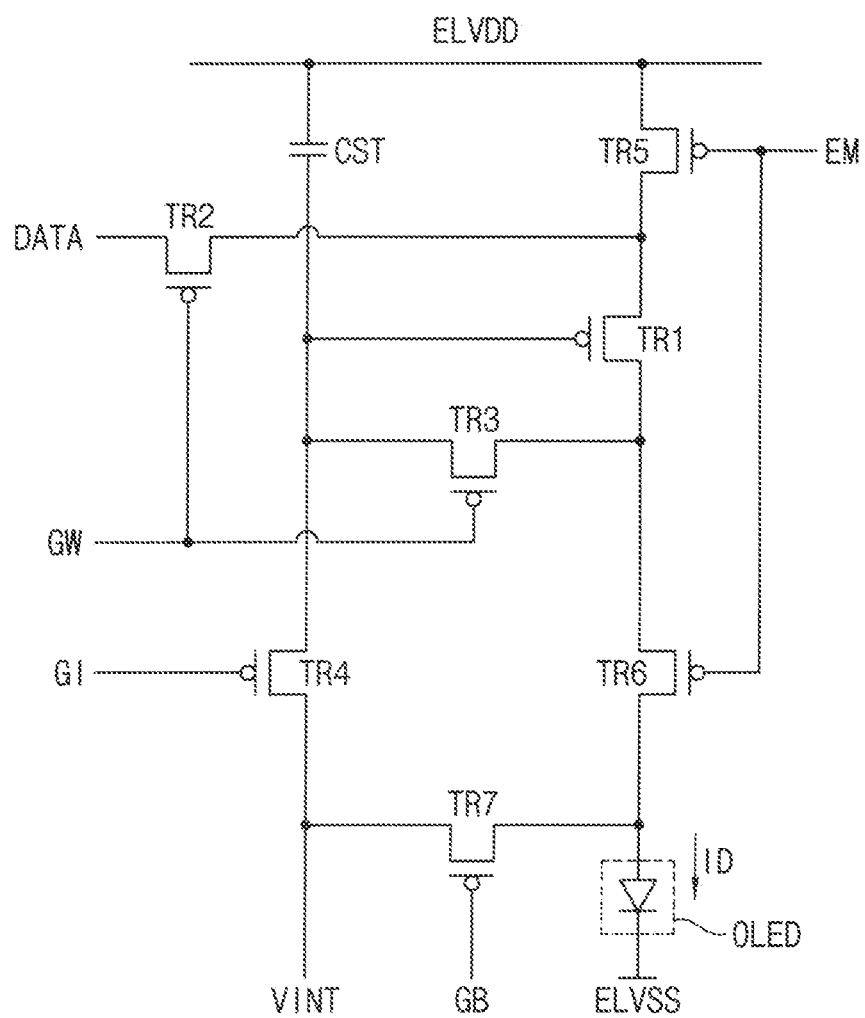
FIG. 2 is a circuit diagram illustrating a pixel included in the display device of FIG. 1.

FIG. 2 is a circuit diagram illustrating a pixel P included in the display device of FIG. 1.

Referring to FIG. 2, each of the pixels P may include at least one transistor and at least one capacitor. For example, as illustrated in FIG. 2, each of the pixels P may include seven transistors TR1, TR2, TR3, TR4, TR5, TR6, TR7 and one capacitor CST. However, in an embodiment, each of the pixels P may include more or less than seven transistor and more or less than one capacitor.

A plurality of signals may be transmitted from the driver to each of the pixels P. For example, a data signal DATA, a plurality of scan signals GW, GI, and GB, and an emission control signal EM may be transmitted to each of the pixels P. In addition, a high power voltage ELVDD and a low power voltage ELVSS may be applied to each of the pixels P. The pixels P may operate a light emitting element connected to the pixels P based on the signals.

In embodiments, the pixels P may be connected to the light emitting element. For example, the pixels P may be connected to the organic light emitting diode OLED. The organic light emitting diode OLED may receive a signal from the pixels P and emit light. Through this, the display device may display an image in the display area DA.

Figure 3:
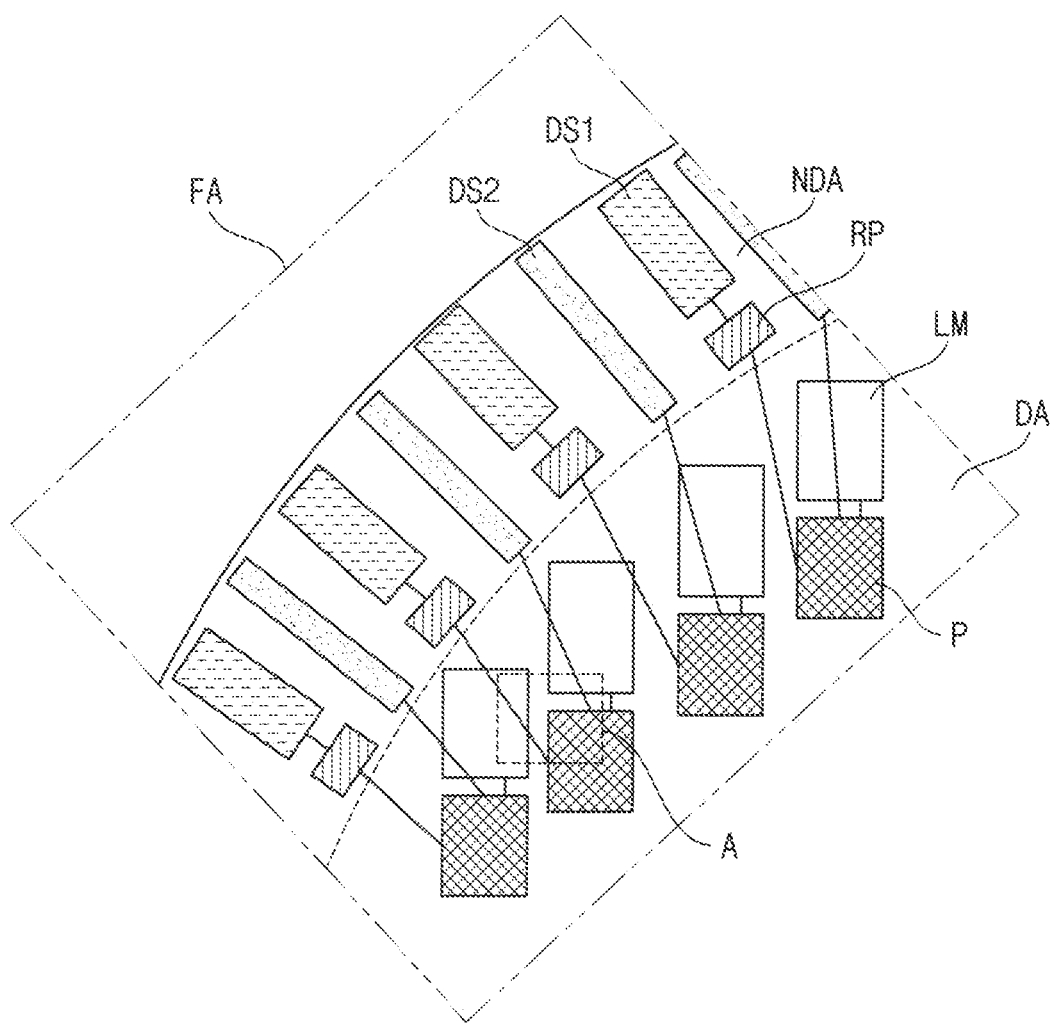
FIG. 3 is an enlarged view illustrating embodiments in which a first area of the display device of FIG. 1 is enlarged.

FIG. 3 is an enlarged view illustrating embodiments in which a first area FA of the display device of FIG. 1 is enlarged.

Referring to FIGS. 1 and 3, the display area DA may include the first area FA. The first area FA may be a part of an upper area of the display device.

In embodiments, a plurality of load matchers LM may be disposed along the edge of the display area DA. The pixels P may be spaced apart from the non-display area NDA by the load matchers LM. However, the load matchers LM may not be disposed in a lower area the display device. Accordingly, the pixels P may be disposed relatively adjacent to the non-display area NDA in the lower area.

Each of the load matchers LM may include a capacitor and a resistor. The load matchers LM may include a plurality of electrode layers constituting the capacitor. Through this, the load matchers LM may serve to adjust a load of the pixels P. For example, the number of pixels P disposed in a first pixel column located in a central area of the display device may be greater than the number of pixels P disposed in a second pixel column located in a side area of the display device. Accordingly, the load of the pixels P disposed in the first pixel column may be larger than the load of the pixels P disposed in the second pixel column. Accordingly, due to the difference in the load, the display device may display an image of non-uniform luminance. Accordingly, the load matchers LM may be connected to the pixels P in the upper area of the display area DA in order to eliminate the load difference.

The load matchers LM may reinforce the load of pixels P disposed in a pixel column having a low load, e.g., a pixel column positioned on a side area. Accordingly, the display device may display an image with uniform luminance.

In embodiments, a plurality of repair pixels RP, a plurality of light emitting control circuits DS1, and a plurality of lighting circuits DS2 may be disposed in the non-display area NDA.

In embodiments, the repair pixels RP may be disposed adjacent to an edge of the display area DA in the non-display area NDA. The repair pixels RP may be connected to the pixels P. The repair pixels RP may be disposed along an edge of the display area DA to be parallel to the display area DA. Since the repair pixels RP are not disposed in the display area DA but are disposed in the non-display area NDA, the space of the display area DA may be effectively utilized. For example, since the repair pixel RP is disposed in the non-display area NDA, a dead space of the display area DA may be reduced. Through this, the display area DA may be secured more widely.

When at least some of the pixels P do not operate normally, the repair pixels RP may transmit a driving current to the light emitting element, e.g., the organic light emitting diode OLED of FIG. 2, connected to the pixels P in place of the some pixels P. Through this, the light emitting element may emit light with a desired luminance. Accordingly, the display device may prevent the display quality from deteriorating.

The repair pixels RP may be connected to the light emitting control circuits DS1. The repair pixels RP may be disposed parallel to the light emitting control circuits DS1.

In embodiments, the plurality of light emitting control circuits DS1 may be disposed along an edge of the display area DA in the non-display area NDA. Further, the plurality of lighting circuits DS2 may be disposed along the edge of the display area DA in the non-display area NDA.

The repair pixels RP may be disposed adjacent to the light emitting control circuits DS1, and may be disposed along the edge of the display area DA in the non-display area NDA. Through this, the dead space of the display area DA may be reduced compared to when the repair pixels RP are disposed in the display area DA.

The lighting circuits DS2 may be disposed between the light emitting control circuits DS1 in the non-display area NDA. In embodiments, the lighting circuits DS2 may be disposed only in the upper non-display area UNDA. The lighting circuits DS2 may be connected to the pixels P. The lighting circuits DS2 may provide a signal to the pixels P to test whether the pixels P operate normally. For example, the lighting circuits DS2 may provide a data signal to the pixels P, and the data signal may be a red data signal, a blue data signal, or a green data signal. However, in embodiments, the lighting circuits DS2 may be removed after testing.

The pixels P may transmit the data signal transmitted from the lighting circuits DS2 to the load matching units LM. This will be described in detail with reference to FIGS. 6 to 8 to be described later.

Figure 4:
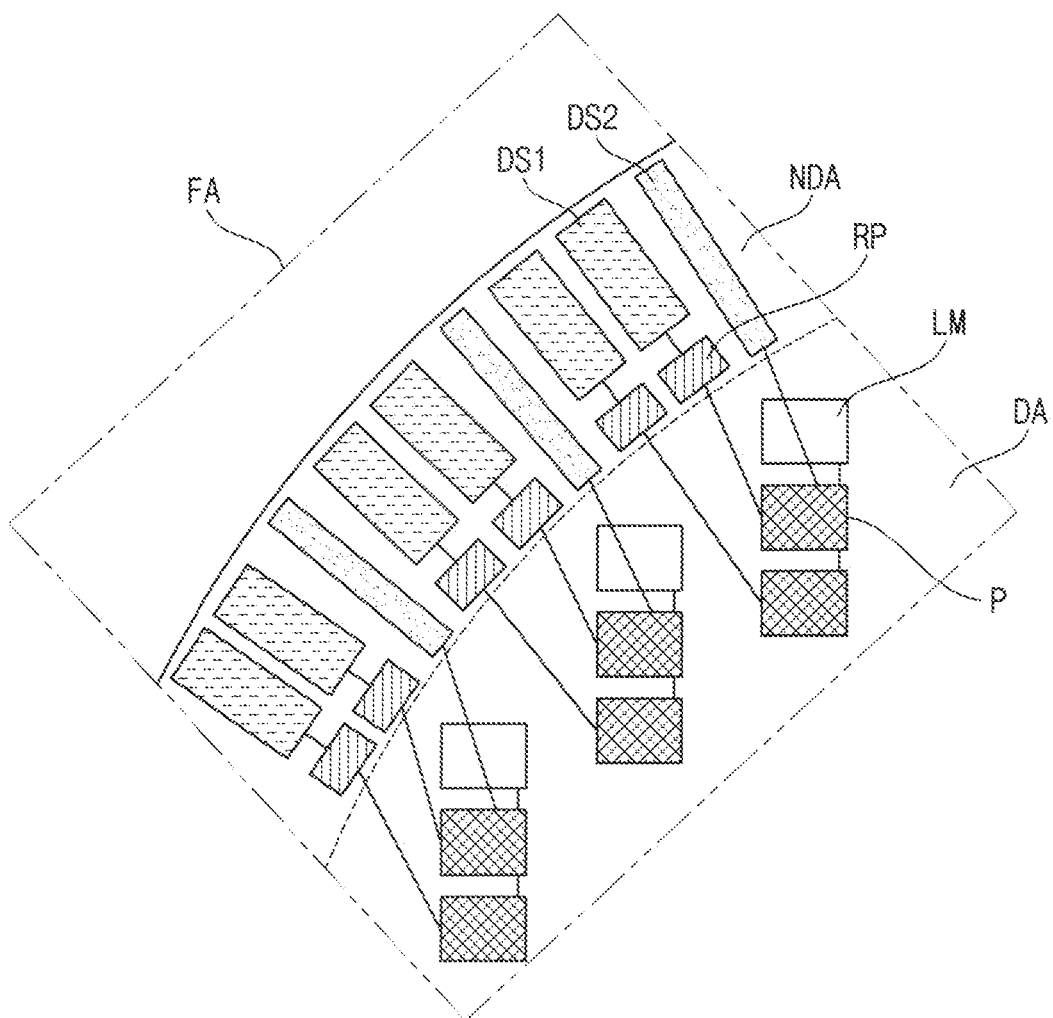
FIG. 4 is an enlarged view illustrating embodiments in which a first area of the display device of FIG. 1 is enlarged.

FIG. 4 is an enlarged view illustrating embodiments in which the first area FA of the display device of FIG. 1 is enlarged. FIG. 4 may be substantially the same as that of FIG. 3 except for the structuring order of the plurality of circuits DS1 and DS2 in the non-display area NDA. Accordingly, a description of the overlapping configuration will be omitted.

In FIG. 3, the light emitting control circuits DS1 and the lighting circuits DS2 are illustrated to be alternately disposed. However, referring to FIGS. 1 and 4, the circuits DS1 and DS2 may not be alternately disposed. For example, two light emitting control circuits DS1 may be disposed between the two lighting circuits DS2. The light emitting control circuits DS1 may be connected to two adjacent pixels P by light emitting control lines, respectively. In this case, as the two light emitting control circuits DS1 are disposed adjacent to each other, an area in which the light emitting control lines are disposed may be minimized. Through this, resistance of the lines may be reduced, and a dead space may be reduced by minimizing an area in which the lines are disposed.

As such, the circuits DS1 and DS2 may be disposed in various ways corresponding to the structuring of the pixels P. In this case, the repair pixels RP may be disposed along the light emitting control circuits DS1 to be connected to the light emitting control circuits DS1.

Figure 5:
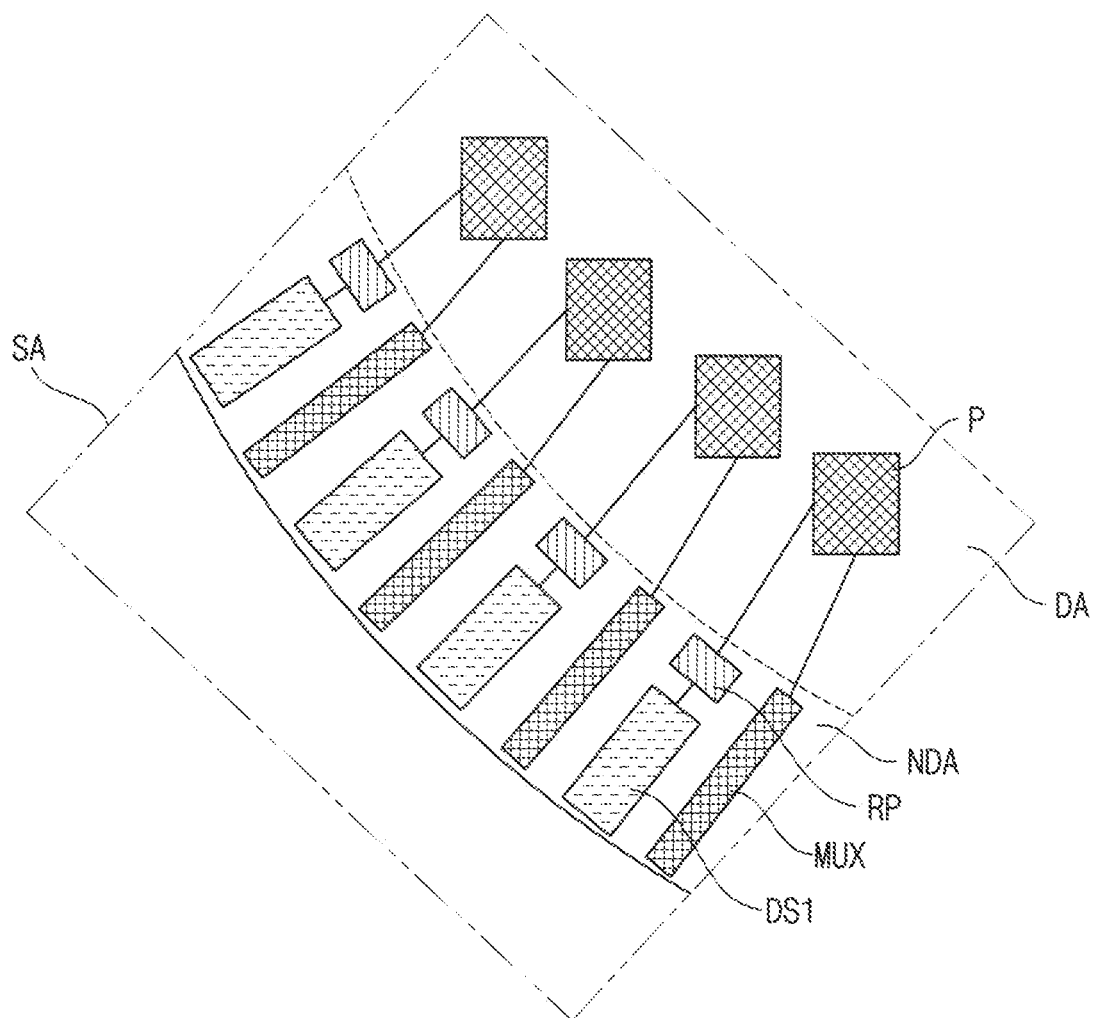
FIG. 5 is an enlarged view illustrating embodiments in which a second area of the display device of FIG. 1 is enlarged.

FIG. 5 is an enlarged view illustrating embodiments in which a second area SA of the display device of FIG. 1 is enlarged.

Referring to FIGS. 1, 3 and 5, the display device may include the second area SA. The second area SA may mean a lower area of the display device. The pixels P, the light emitting control circuits DS1, and the repair pixels RP may be disposed in the second area SA in the same manner as the first area FA.

However, the lighting circuits DS2 may not be disposed in the second area SA. Instead, a plurality of mux circuits MUX may be disposed in the second area SA. Each of the mux circuits MUX may receive a data input signal and divide it into one or more data output signals and transmit them. The mux circuit MUX may be connected to a plurality of pixels P. For example, the mux circuit MUX may be connected to two pixels P, and may also be connected to three or more pixels P. In this way, the display device may minimize a space in which lines are disposed the lower area of the display device through the mux circuit MUX.

Figure 6:
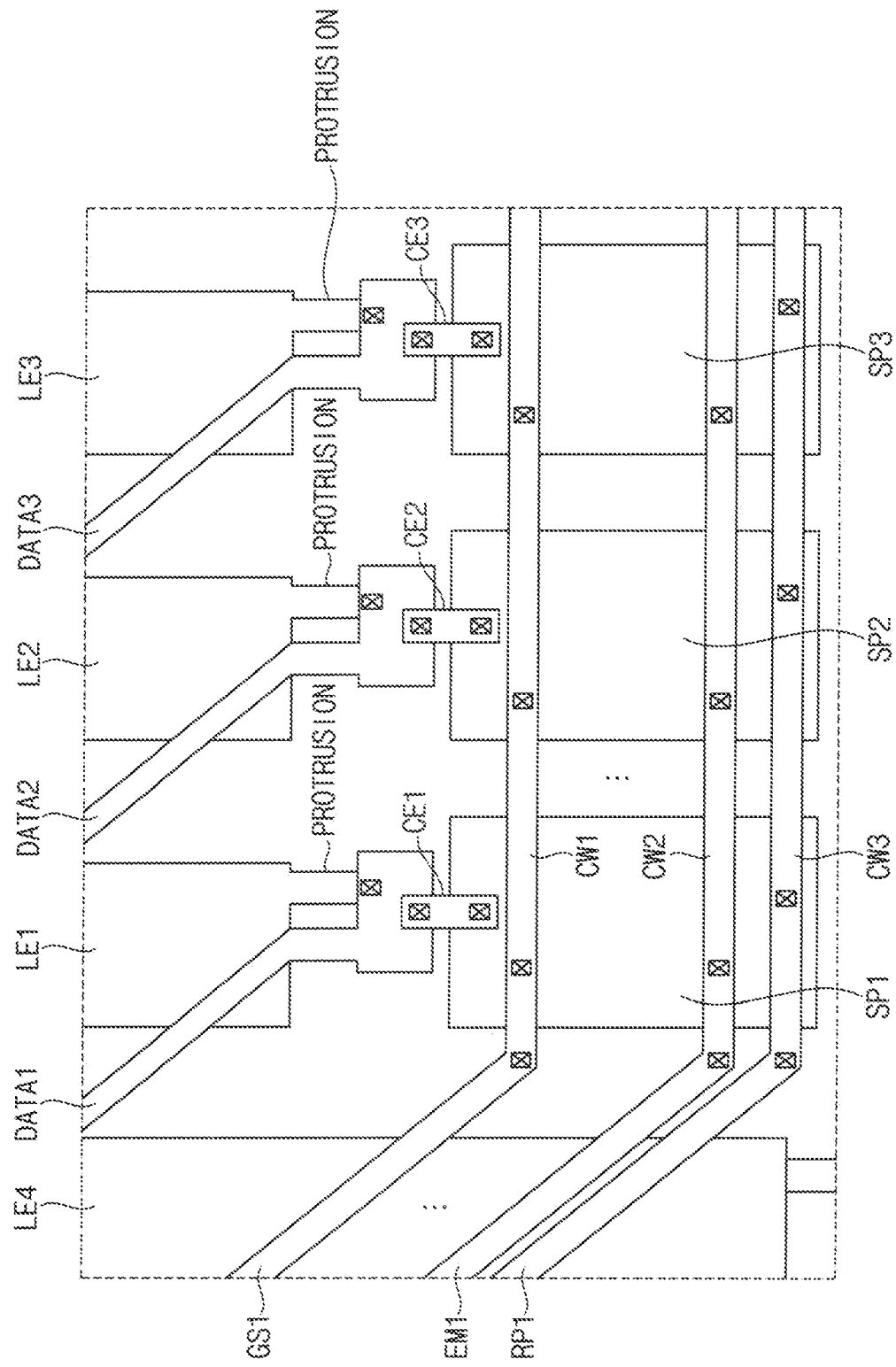
FIGS. 6, 7, and 8 are layout diagrams schematically illustrating a connection relationship between pixels.
Figure 7:
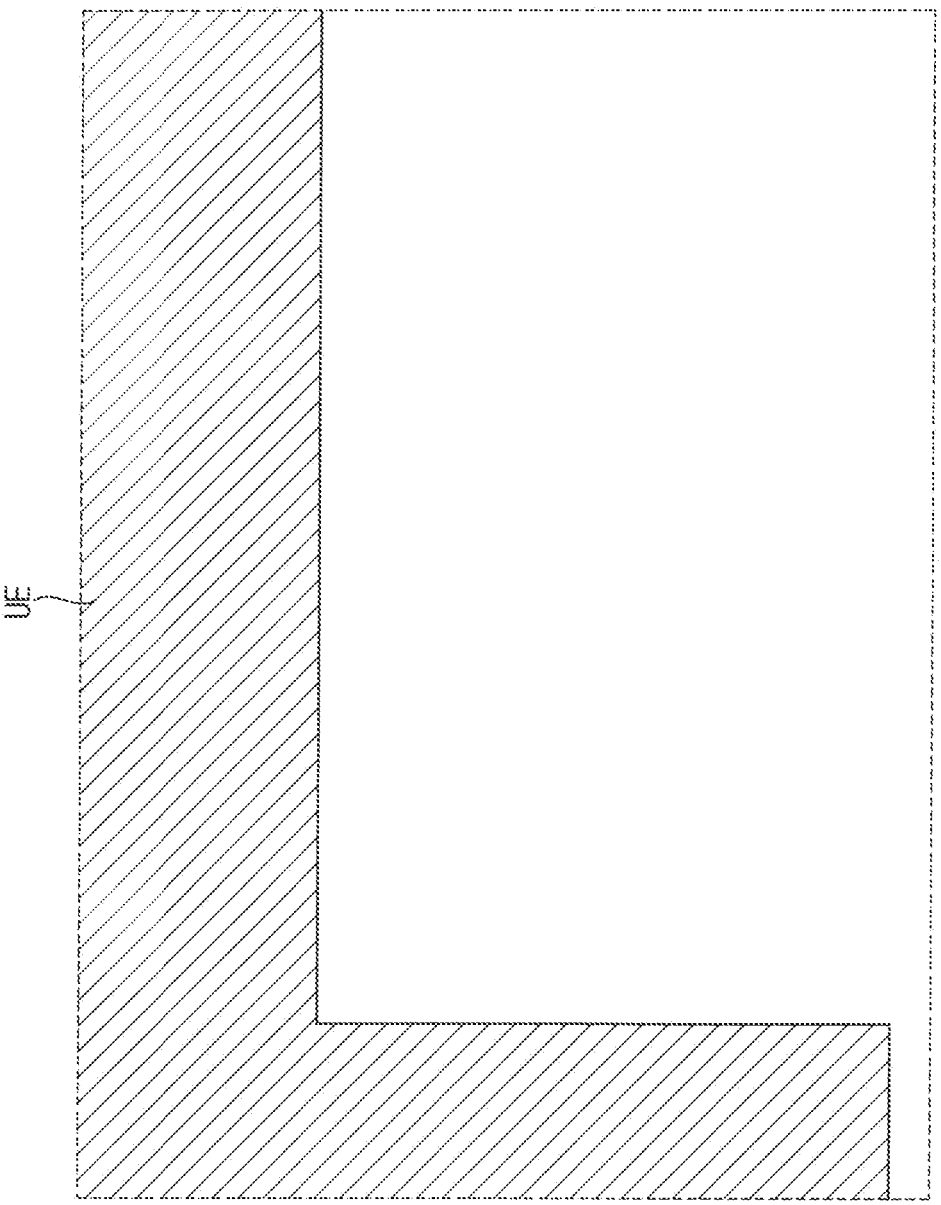
Figure 8:
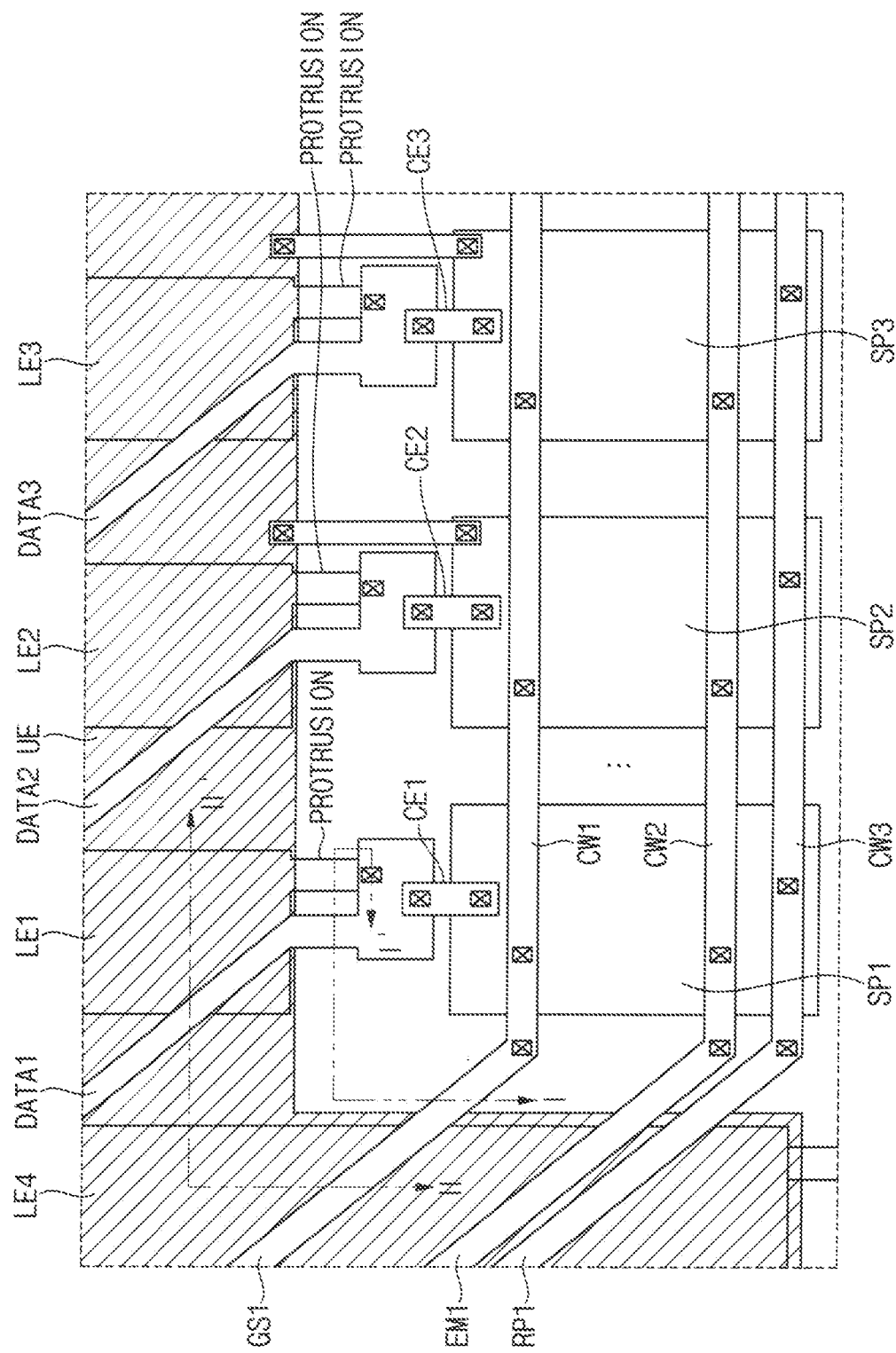

FIGS. 6 to 8 are layout diagrams schematically illustrating a connection relationship between pixels. FIGS. 6 to 8 may roughly correspond to area A of FIG. 3.

Referring to FIG. 6, the display device may include a plurality of lower electrodes LE1, LE2, LE3, LE4. The lower electrodes LE1, LE2, LE3, LE4 may include a conductive material. For example, the lower electrodes LE1, LE2, LE3, LE4 may include a metal, an alloy, a conductive metal oxide, a transparent conductive material, and the like. For example, the lower electrodes LE1, LE2, LE3, LE4 may include one of silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like.

In embodiments, a data signal, e.g., the data signal DATA of FIG. 2, may be applied to the lower electrodes LE1, LE2, LE3, LE4. The first lower electrode LE1 may be connected to a first data line DATA1, the second lower electrode LE2 may be connected to a second data line DATA2, and the third lower electrode LE3 be connected to the third data line DATA3. Through this, a first data signal may be applied to the first lower electrode LE1, a second data signal may be applied to the second lower electrode LE2, and a third data signal may be applied to the third lower electrode LE3. In this case, the first to third data signals may be different data signals. For example, the first data signal may be a red data signal, the second data signal may be a green data signal, and the third data signal may be a blue data signal. A data signal may be applied to the fourth lower electrode LE4 through a separate data line. For example, a blue data signal may be applied to the fourth lower electrode LE4.

The lower electrodes LE1, LE2, LE3 may be connected to the pixel through the data lines DATA1, DATA2, DATA3. The pixel may include a plurality of sub-pixels SP1, SP2, SP3. In embodiments, the lower electrodes LE1, LE2, LE3 may be connected to the sub-pixels SP1, SP2, SP3 through the data lines DATA1, DATA2, DATA3. To this end, the lower electrodes LE1, LE2, LE3 may be connected to the data lines DATA1, DATA2, DATA3 through a contact hole. The data lines DATA1, DATA2, DATA3 may be connected to the lighting circuit DS2 of FIG. 3.

In embodiments, the lower electrodes LE1, LE2, LE3 may include protrusions protruding to the sub-pixels SP1, SP2, SP3. Each of the protrusions may overlap the data lines DATA1, DATA2, DATA3. With the protrusions, the lower electrodes LE1, LE2, LE3 may be connected to the data lines DATA1, DATA2, DATA3 by contact holes, respectively.

In addition, the data lines DATA1, DATA2, DATA3 may be connected to the sub-pixels SP1, SP2, SP3. Different data signals may be applied to each of the sub-pixels SP1, SP2, SP3. For example, a red data signal may be applied to the first sub-pixel SP1, a green data signal may be applied to the second sub-pixel SP2, and a blue data signal may be applied to the third sub-pixel SP3.

In addition, various signals may be transmitted to the sub-pixels SP1, SP2, SP3. For example, the scan signal transmitted through the first scan line GS1 may transmit the scan signal to the sub-pixels SP1, SP2, SP3 through a first transmission line CW1. Also, although not illustrated, various scan signals may be transmitted to the sub-pixels SP1, SP2, and SP3 through additional scan lines and additional transmission lines.

In addition, a light emitting control signal may be transmitted to the sub-pixels SP1, SP2, SP3. The light emitting control signal transmitted through a light emitting control line EM1 may be transmitted to the sub-pixels SP1, SP2, SP3 through a second transmission line CW2. The light emitting control line EM1 may be connected to the light emitting control circuit DS1 of FIG. 3.

In addition, a repair signal may be transmitted to the sub-pixels SP1, SP2, SP3. The repair signal transmitted through the repair line RP1 may be transmitted to the sub-pixels SP1, SP2, SP3 through a third transmission line CW3. The repair line RP1 may be connected to the repair pixel RP of FIG. 3.

In embodiments, the repair wiring RP1 may be connected to a first side of the first sub-pixel SP1. The first data line DATA1 may be connected to a second side of the first sub-pixel SP1. The first side and the second side may be perpendicular to each other.

Referring to FIGS. 7 and 8, the display device may include an upper electrode UE. In embodiments, a power voltage may be applied to the upper electrode UE. For example, the high power voltage ELVDD of FIG. 3 may be applied to the upper electrode UE.

As the high power voltage ELVDD is applied to the upper electrode UE, the upper electrode UE may form a capacitor together with the lower electrodes LE1, LE2, LE3, LE4 of FIG. 6.

The above-described load matcher may include a resistor and a capacitor. In this case, the capacitor may be formed by the upper electrode UE and the lower electrodes LE1, LE2, LE3, LE4. A first connection electrode may connect the first data line DATA1 and the first sub-pixel SP1. A second connection electrode CE2 may connect the second data line DATA2 and the second sub-pixel SP2. A third connection electrode CE3 may connect the third data line DATA3 and the third sub-pixel SP3.

Figure 9:
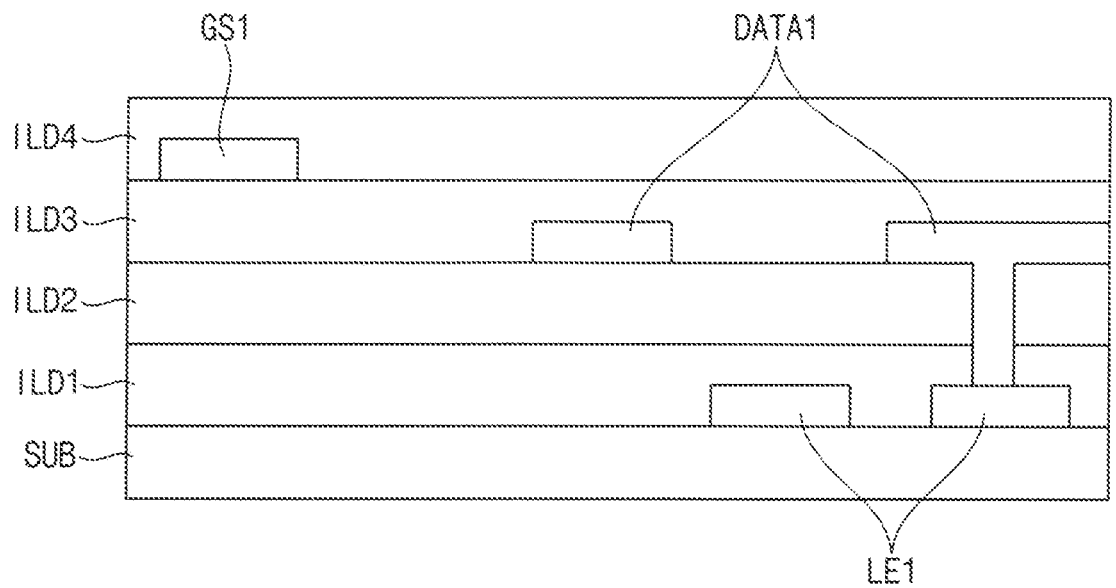
FIGS. 9, 10, and 11 are cross-sectional views illustrating embodiments taken along the line I-I' of FIG. 8.
Figure 10:
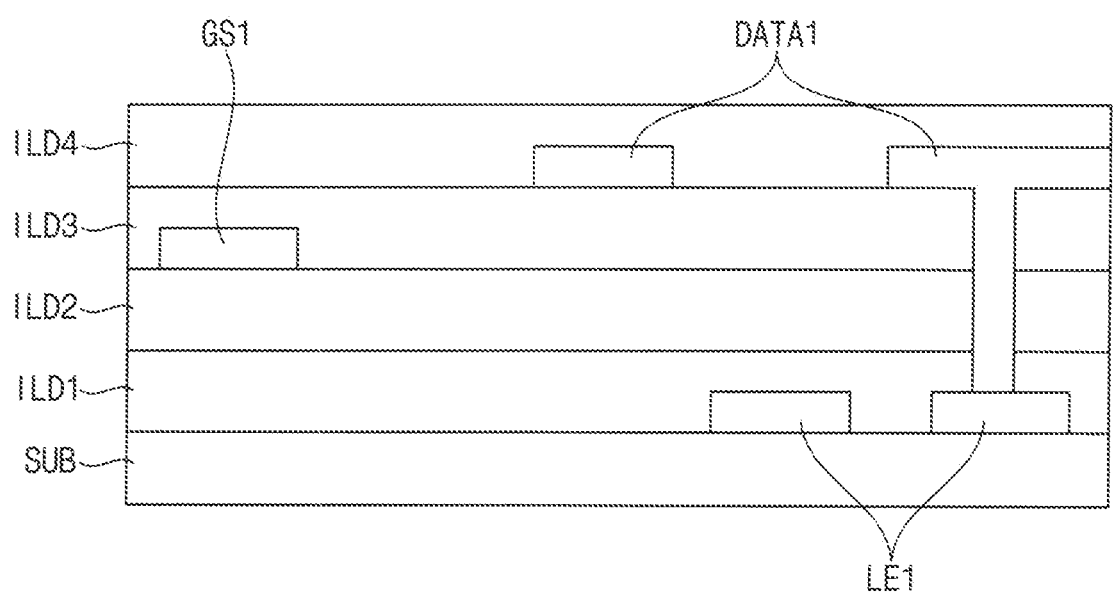
Figure 11:
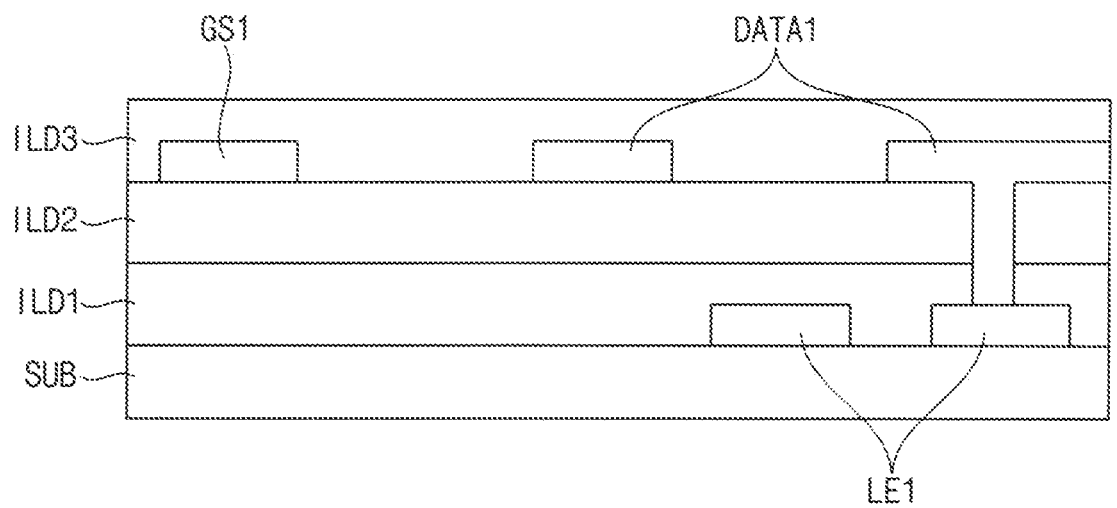

FIGS. 9 to 11 are cross-sectional views illustrating embodiments taken along the line I-I' of FIG. 8.

Referring to FIGS. 8 and 9, the display device may include a substrate SUB. In embodiments, the substrate SUB may include plastic, and accordingly, the substrate SUB may have a flexible characteristic. For example, the substrate SUB may include polyimide. However, in embodiments, the substrate SUB may include a glass material, and accordingly, the substrate SUB may have a rigid characteristic. For example, the substrate SUB may include quartz.

The first lower electrode LE1 may be disposed on the substrate SUB. The first lower electrode LE1 may include a conductive material. For example, the first lower electrode LE1 may include a metal, an alloy, a conductive metal oxide, a transparent conductive material, or the like. In embodiments, a data signal may be applied to the first lower electrode LE1.

A first insulating layer ILD1 may be disposed on the substrate SUB to cover the first lower electrode LE1. The first insulating layer ILD1 may include an inorganic insulating material. For example, the first insulating layer ILD1 may include silicon oxide, silicon nitride, silicon oxynitride, or the like.

A second insulating layer ILD2 may be disposed on the first insulating layer ILD1. The second insulating layer ILD2 may include an inorganic insulating material. For example, the second insulating layer ILD2 may include silicon oxide, silicon nitride, silicon oxynitride, or the like.

The first data line DATA1 may be disposed on the second insulating layer ILD2. A part of the first data line DATA1 may overlap a part of the lower electrode LE1. In addition, the part of the first data line DATA1 may be electrically connected to the part of the lower electrode LE1 through a contact hole, e.g., a hole containing an electrically conductive material. Through this, a data signal flowing through the first data line DATA1 may be transmitted to the first lower electrode LE1.

A third insulating layer ILD3 may be disposed on the second insulating layer ILD2 to cover the first data line DATA1. The third insulating layer ILD3 may include an organic insulating material. For example, the third insulating layer ILD3 may include polyimide or the like. The third insulating layer ILD3 may have a flat top surface through a planarization process. That is, the third insulating layer ILD3 may be defined as a planarization layer. Alternatively, in embodiments, the third insulating layer ILD3 may include an inorganic insulating material.

The first scan line GS1 may be disposed on the third insulating layer ILD3. A scan signal may be applied to the first scan line GS1. Alternatively, as illustrated in FIG. 10, the first scan line GS1 may be disposed on the third insulating layer ILD3, and the first data line DATA1 may be disposed on the fourth insulating layer ILD4. In this way, the first scan line GS1 may be disposed on a layer different from that of the first data line DATA1. Through this, the display device may secure a space in which a plurality of wires may be disposed.

In embodiments, as illustrated in FIG. 11, the first data line DATA1 and the first scan line GS1 may be disposed on the same layer, e.g., on the second insulating layer ILD2.

Figure 12:
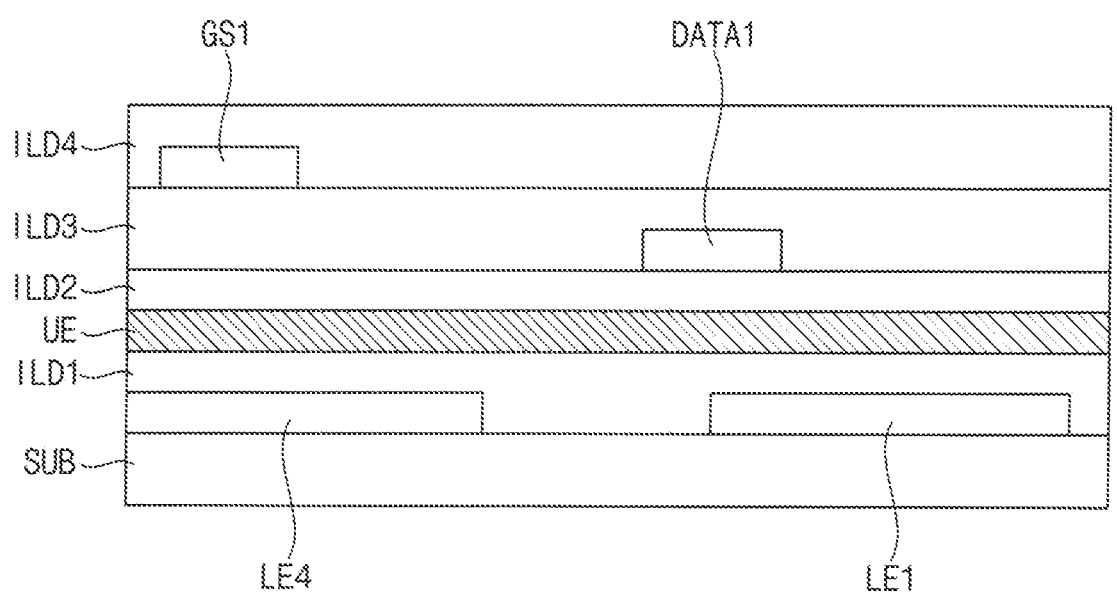
FIGS. 12, 13, and 14 are cross-sectional views illustrating embodiments taken along the line II-II' of FIG. 8.
Figure 13:
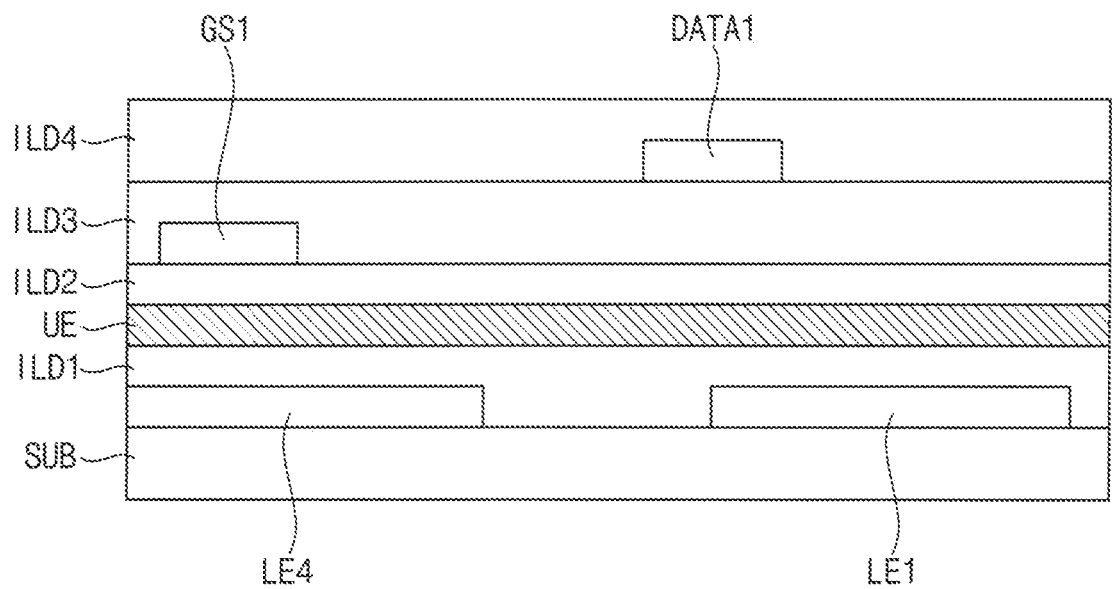
Figure 14:
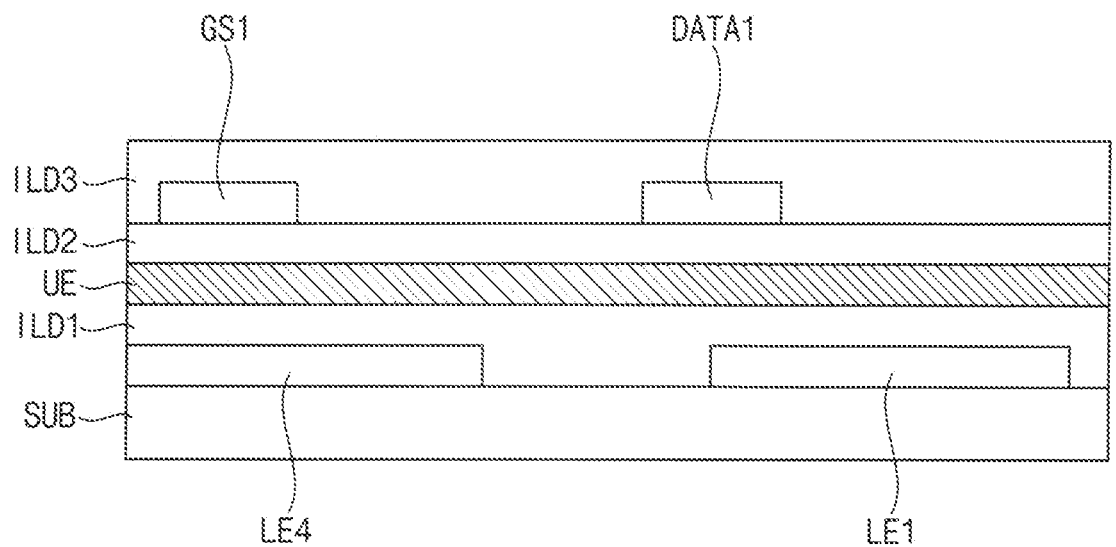

FIGS. 12 to 14 are cross-sectional views illustrating embodiments taken along the line II-II' of FIG. 8.

Referring to FIGS. 8 and 12, the display device may include the substrate SUB. In embodiments, the substrate SUB may include plastic, and accordingly, the substrate SUB may have a flexible characteristic. For example, the substrate SUB may include polyimide. Alternatively, in embodiments, the substrate SUB may include a glass material, and accordingly, the substrate SUB may have a rigid characteristic. For example, the substrate SUB may include quartz.

The first lower electrode LE1 and the fourth lower electrode LE4 may be disposed on the substrate SUB. The first lower electrode LE1 and the fourth lower electrode LE4 may include a conductive material. For example, the first lower electrode LE1 and the fourth lower electrode LE4 may include a metal, an alloy, a conductive metal oxide, a transparent conductive material, and the like. In embodiments, a data signal may be applied to the first lower electrode LE1 and the fourth lower electrode LE4.

The first insulating layer ILD1 may be disposed on the substrate SUB to cover the first lower electrode LE1 and the fourth lower electrode LE4. The first insulating layer ILD1 may include an inorganic insulating material. For example, the first insulating layer ILD1 may include silicon oxide, silicon nitride, silicon oxynitride, or the like.

The upper electrode UE may be disposed on the first insulating layer ILD1. The upper electrode UE may include a conductive material. For example, the upper electrode UE may include a metal, an alloy, a conductive metal oxide, a transparent conductive material, or the like. In embodiments, a power voltage may be applied to the upper electrode UE. For example, a high power voltage ELVDD may be applied to the upper electrode UE. The upper electrode UE may overlap the lower electrodes LE1 and LE4. Through this, each of the lower electrodes LE1 and LE4 may form a capacitor together with the upper electrode UE. Each of the lower electrodes LE1 and LE4 may form a load matcher together with the upper electrode UE.

The second insulating layer ILD2 may be disposed on the upper electrode UE. The second insulating layer ILD2 may include an inorganic insulating material. For example, the second insulating layer ILD2 may include silicon oxide, silicon nitride, silicon oxynitride, or the like.

The first data line DATA1 may be disposed on the second insulating layer ILD2. The first data line DATA1 may include a conductive material. For example, the first data line DATA1 may include a metal, an alloy, a conductive metal oxide, a transparent conductive material, or the like. A data signal may be applied to the first data line DATA1. The first data line DATA1 may be connected to the lighting circuit DS2 of FIG. 3. For example, the first data line DATA1 may receive a red data signal from the lighting circuit DS2 of FIG. 3.

In this way, since the upper electrode layer constituting the first data line DATA1 may be disposed on a layer different from the lower electrode layers constituting the load matcher, the upper electrode layer and the lower electrode layers may be disposed to overlap each other. Through this, the display device may reduce dead space.

The third insulating layer ILD3 may be disposed on the second insulating layer ILD2 to cover the first data line DATA1. The third insulating layer ILD3 may include an organic insulating material. For example, the third insulating layer ILD3 may include a polymer compound such as polyimide. Alternatively, the third insulating layer ILD3 may include an inorganic insulating material. For example, the third insulating layer ILD3 may include silicon oxide, silicon nitride, silicon oxynitride, or the like.

The scan line GS1 may be disposed on the third insulating layer ILD3. The scan line GS1 may include a conductive material. For example, the scan line GS1 may include a metal, an alloy, a conductive metal oxide, a transparent conductive material, or the like. The scan line GS1 may be connected to the scan driver. Accordingly, a scan signal may be applied to the scan line GS1.

In this way, the upper electrode layer constituting the scan line GS1 may disposed on a layer different from the lower electrode layers constituting the load matcher, so that the upper electrode layer and the lower electrode layer may be disposed to overlap each other. Through this, the display device may reduce dead space.

The relationship of the electrode layers can be other than that illustrated in FIG. 12. For example, as illustrated in FIG. 13, the first data line DATA1 may be disposed on a layer, e.g., the third insulating layer ILD3, disposed on the scan line GS1.

Alternatively, as illustrated in FIG. 14, the first data line DATA1 and the scan line GS1 may be disposed on the same layer, e.g., the second insulating layer ILD2.

Figure 15:
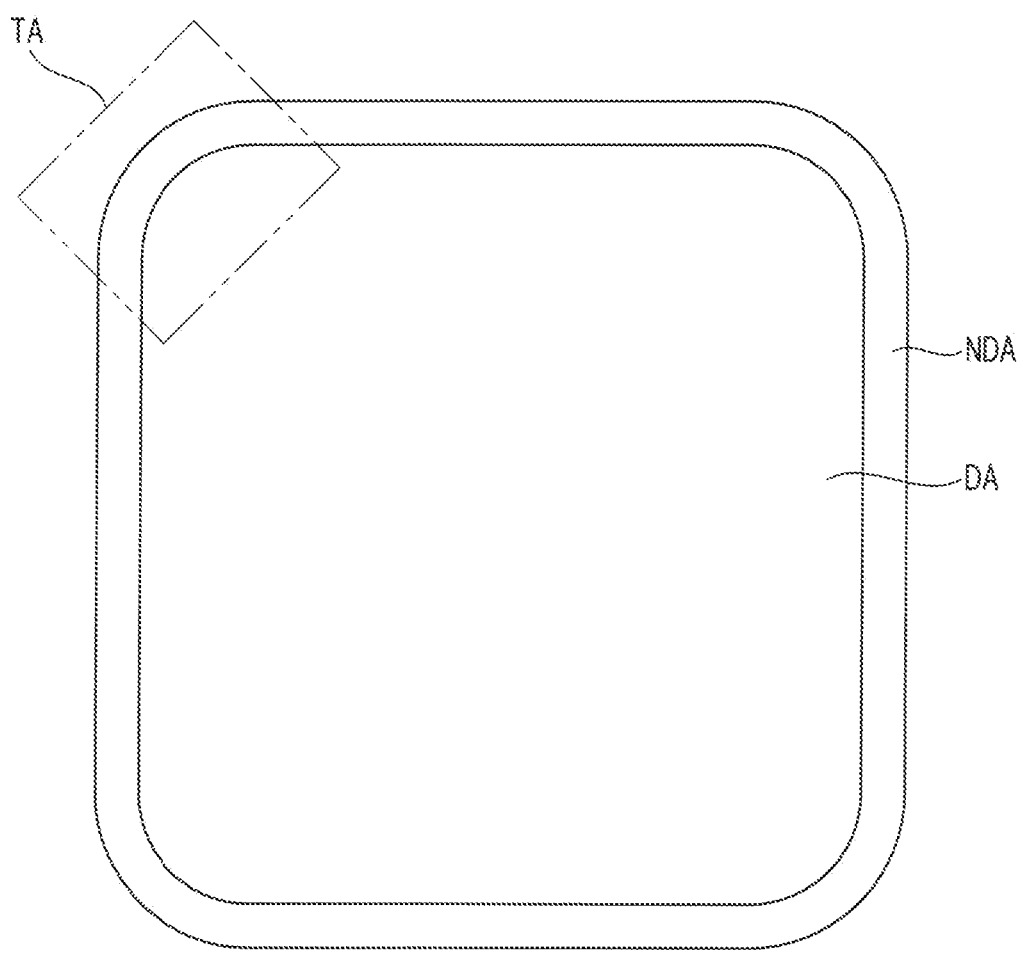
FIG. 15 is a plan view illustrating a display device according to an embodiment.

FIG. 15 is a plan view illustrating a display device according to an embodiment.

Referring to FIG. 15, the display device may include a display area DA and a non-display area surrounding the display area DA. The display area DA may have a shape including a curved portion having a curvature at a portion where two edges meet.

A structuring of pixels and drivers disposed adjacent to the curvature may be different from a structuring of pixels and drivers disposed adjacent to an edge. For example, the third area TA including the curved portion may have substantially the same structure as the first area FA of FIG. 1.

As described above, embodiments may be applied to a display device having a structure in which at least some areas have a curvature.

The display device according to the embodiments may be applied to a display device included in a computer, a notebook, a mobile phone, a smartphone, a smart pad, a PMP, a PDA, an MP3 player, or the like within the spirit and the scope of the disclosure.

Although the display devices according to embodiments have been described with reference to the drawings, the illustrated embodiments are examples, and may be modified and changed by a person having ordinary skill in the art without departing from the technical spirit described in the following claims.

What is claimed is:

1. A display device comprising:
   a circular display area;
   a non-display area surrounding the circular display area;
   a load matcher disposed adjacent to an edge of the circular display area in the circular display area;
   a pixel disposed in the circular display area, spaced apart from the non-display area by the load matcher, and connected to the load matcher; and a repair pixel disposed adjacent to the edge of the circular display area in the non-display area, and connected to the pixel.

2. The display device of claim 1, further comprising:
a light emitting control driver disposed in the non-display area, and spaced apart from the circular display area by the repair pixel, and
wherein the repair pixel is connected to the light emitting control driver.

3. The display device of claim 2, further comprising:
a lighting circuit disposed in the non-display area, and connected to the pixel.

4. The display device of claim 3, wherein the repair pixel is connected to a first side of the pixel, and the lighting circuit is connected to a second side perpendicular to the first side of the pixel.

5. The display device of claim 3, wherein the light emitting control driver includes a plurality of light emitting control circuits and the lighting circuit is disposed between the plurality of light emitting control circuits.

6. The display device of claim 3, wherein the lighting circuit transmits a data signal to the pixel.

7. The display device of claim 3, wherein the load matcher including:
a lower electrode connected to the lighting circuit; and
an upper electrode disposed on the lower electrode, and overlapping the lower electrode.

8. The display device of claim 7, wherein the lower electrode includes protrusion protruding toward the pixel, the protrusion overlaps a data line connecting the pixel and the lighting circuit, and the protrusion is connected to the data line by a contact hole.

9. The display device of claim 8, wherein the data line is disposed on the upper electrode, and partially overlaps the upper electrode.

10. The display device of claim 7, wherein a data signal is applied to the lower electrode and a power voltage is applied to the upper electrode.

11. The display device of claim 10, wherein the power voltage is a high power voltage.

12. The display device of claim 7, wherein the lower electrode and the upper electrode form a capacitor.

13. The display device of claim 1, wherein the load matcher is disposed only on the display device.

14. A display device comprising:
a display area including a curved portion having a curvature;
a non-display area surrounding the display area;
a load matcher disposed adjacent to an edge of the curved portion in the display area;
a pixel disposed in the display area, spaced apart from the non-display area by the load matcher, and connected to the load matcher; and
a repair pixel disposed adjacent to the edge of the curved portion in the non-display area, and connected to the pixel.

15. The display device of claim 14, further comprising:
a light emitting control driver disposed in the non-display area, and spaced apart from the display area by the repair pixel, and
wherein the repair pixel is connected to the light emitting control driver.

16. The display device of claim 15, further comprising:
a lighting circuit disposed in the non-display area, and connected to the pixel.

17. The display device of claim 16, wherein the repair pixel is connected to a first side of the pixel, and the lighting circuit is connected to a second side perpendicular to the first side of the pixel.

18. The display device of claim 16, wherein the light emitting control driver includes a plurality of light emitting control circuits and the lighting circuit is disposed between the plurality of light emitting control circuits.

19. The display device of claim 16, wherein the load matcher including:
a lower electrode connected to the lighting circuit; and
an upper electrode disposed on the lower electrode, and overlapping the lower electrode.

20. The display device of claim 19, wherein the lower electrode includes a protrusion protruding toward the pixel, the protrusion overlaps a data line connecting the pixel and the lighting circuit, and the protrusion is connected to the data line by a contact hole.

* * * * *